(12) United States Patent
Liu et al.

(10) Patent No.: US 6,746,900 B1
(45) Date of Patent: Jun. 8, 2004

(54) METHOD FOR FORMING A SEMICONDUCTOR DEVICE HAVING HIGH-K GATE DIELECTRIC MATERIAL

(75) Inventors: Ai-Sen Liu, Hsinchu (TW); Baw-Ching Perng, Hsinchu (TW); Ming-Ta Lei, Hsin Chu (TW); Wen-Kai Wan, Hsin chu (TW); Cheng-Chung Lin, Taipei (TW); Kuei-Wu Huang, Hsin-chu (TW); Yih-Shung Lin, Sanchung (TW); Chia-Hui Lin, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/369,992

(22) Filed: Feb. 19, 2003

(51) Int. Cl.[7] .................. H01L 21/335; H01L 21/8232; H01L 21/44
(52) U.S. Cl. ........................ 438/142; 438/678; 438/675
(58) Field of Search ................... 438/142, 591, 438/675, 585, 678, 424, 791, 197

(56) References Cited

U.S. PATENT DOCUMENTS

| | | | | |
|---|---|---|---|---|
| 5,960,270 A | * | 9/1999 | Misra et al. ................. | 438/197 |
| 5,963,818 A | * | 10/1999 | Kao et al. .................... | 438/424 |
| 6,194,768 B1 | | 2/2001 | Gardner et al. | |
| 6,210,999 B1 | | 4/2001 | Gardner et al. | |
| 6,344,413 B1 | * | 2/2002 | Zurcher et al. ............. | 438/678 |
| 6,391,752 B1 | * | 5/2002 | Colinge et al. ............. | 438/585 |
| 6,406,945 B1 | * | 6/2002 | Lee et al. .................... | 438/142 |
| 6,455,424 B1 | * | 9/2002 | McTeer et al. ............. | 438/675 |
| 6,495,437 B1 | * | 12/2002 | Yu .............................. | 438/591 |
| 6,573,197 B2 | * | 6/2003 | Callegari et al. ........... | 438/791 |

* cited by examiner

Primary Examiner—John F. Niebling
Assistant Examiner—Walter L. Lindsay, Jr.
(74) Attorney, Agent, or Firm—Duane Morris LLP

(57) ABSTRACT

In a method of forming an integrated circuit, a sacrificial layer is formed over a substrate. The sacrificial layer has a gate trench formed therein and a first layer of a first material formed over the substrate in the gate trench. A second layer of a second material is formed over the first layer in the gate trench. The first and second layers are processed to form a layer of a high-K dielectric material.

25 Claims, 4 Drawing Sheets

METHOD FOR FORMING A SEMICONDUCTOR DEVICE HAVING HIGH-K GATE DIELECTRIC MATERIAL

FIELD OF THE INVENTION

The present invention relates to methods of forming semiconductor devices, and more particularly to methods of forming semiconductor devices including high-K dielectric layers.

BACKGROUND OF THE INVENTION

As metal oxide semiconductor field effect transistor (MOSFET) feature sizes decrease, the gate oxide thickness of the devices also decreases. This decrease is driven in part by the demands of overall device scaling. As gate conductor widths decrease, for example, other device dimensions decrease to maintain the proper device scale, and thus device operation. Another factor driving reduction of the gate oxide thickness is the increased transistor drain current realized from a reduced gate dielectric thickness. The transistor drain current is proportional to the amount of charge induced in the transistor channel region by the voltage applied to the gate conductor. The amount of charge induced by a given voltage drop across the gate dielectric (e.g., the gate oxide) is a factor of the capacitance of the gate dielectric.

In order to achieve increased capacitance, gate oxide thicknesses have been decreased to as thin as 10 Å. These extremely thin gate oxides can result in gate oxide breakdown and shifts in threshold voltage of the device from its design specification, likely due to trapped charge that accumulates over time. These concerns have driven an interest in the use of materials that have dielectric constants that are greater than the dielectric constant of silicon oxide, which has a K value of 3.9 Higher K values of 20 or more can be obtained with various transition metal oxides. These "high-K materials" allow high capacitances to be achieved with relatively thick dielectric layers. In this manner, the reliability problems associated with very thin dielectric layers can be avoided while improving transistor performance.

There are fabrication problems associated with forming gate dielectric layers that include high-K materials, particularly when a metal gate is employed. One problem is that high-K materials are generally very difficult to etch. Therefore, there remains a need for a new method of fabricating integrated circuit devices having high-K dielectric layers.

SUMMARY OF THE INVENTION

In a method of forming an integrated circuit, a sacrificial layer is formed over a substrate. The sacrificial layer has a gate trench formed therein and a first layer of a first material formed over the substrate in the gate trench. A second layer of a second material is formed over the first layer in the gate trench. The first and second layers are processed to form a layer of a high-K dielectric material.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1A:
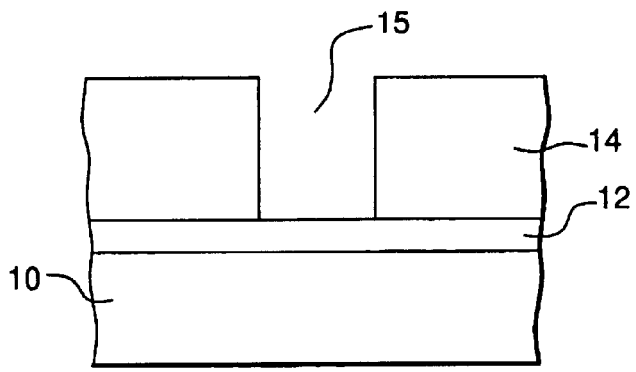
FIGS. 1A–1G illustrate a first exemplary method of forming a device structure including a high-K dielectric layer.

FIGS. 1A–1F illustrate a first embodiment of a method of fabricating a semiconductor device including a high-K dielectric material. Referring first to FIG. 1A, a semiconductor substrate 10, such as a silicon, germanium or silicon on insulator (SOI) substrate, is provided. A dielectric layer 12, such as an oxide layer, is formed over substrate 10. A sacrificial layer 14 is deposited over the layer 12, such as by chemical vapor deposition (CVD), and patterned and etched to form a gate trench region 15. Sacrificial layer 14 should have a higher etch rate relative to a selected etchant than layer 12 (including layer 12 being inert with respect to the etchant), so that layer 12 can serve as an etch stop layer in the later removal of sacrificial layer 14. In one embodiment, sacrificial layer 14 is silicon nitride and is deposited to a thickness of between about 1500–2000 Å.

Figure 1B:
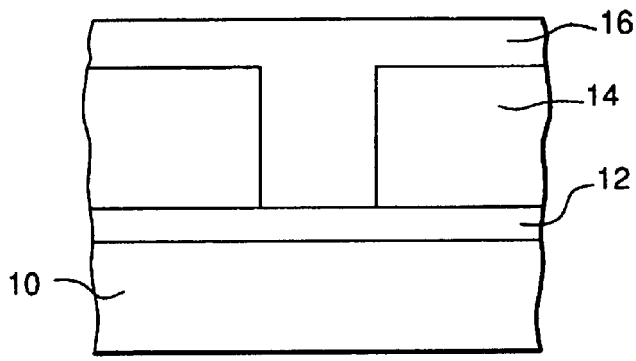
Figure 1C:
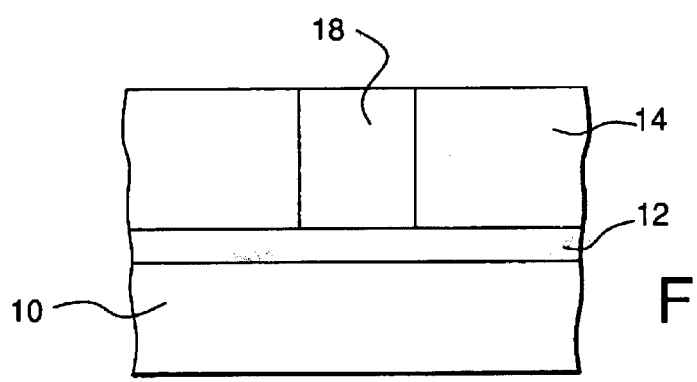

As shown in FIG. 1B, a metal layer 16 is deposited over sacrificial layer 14 and in gate trench region 15. Metal layer 16 may be deposited by physical vapor deposition (PVD) or electrochemical plating (ECP), for example. The metal layer 16 is then polished to the top surface of sacrificial layer 14, such as in a chemical mechanical polishing (CMP) process, to planarize the structure (FIG. 1C), leaving gate trench metal layer 18.

The materials for layer 12 and metal layer 16 (and gate trench metal layer 18) are selected such that they may be processed to form a high-K dielectric layer as described in more detail below. The metal preferably includes Tantalum, Hafnium or Zirconium, but other metals may be used that are capable of forming high-K dielectric oxides. Exemplary combinations of dielectric layer 12 and metal layers 16, 18 are shown in a table hereafter along with the high-K material resulting from a reaction therebetween.

| METAL | OXIDE | RESULTANT HIGH-K MATERIAL AFTER PROCESSING |
|---|---|---|
| Ta | $SiO_2$ | $Ta_2O_5$ |
| Hf | $SiO_2$ | $HfO_2$ |
| Zr | $SiO_2$ | $ZrO_2$ |
| Ti | $SiO_2$ | $TiO_2$ |
| Y | $SiO_2$ | $Y_2O_5$ |
| La | $SiO_2$ | $La_2O_5$ |

The byproduct of the reaction may include a metal silicide, which is conductive. For example, $(x+1)Hf + xSiO_2 \rightarrow xHfO_2 + HfSi_x$.

Figure 1D:
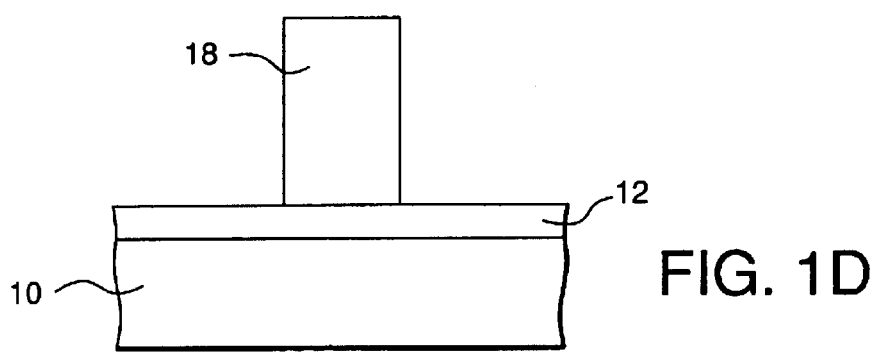
Figure 1E:
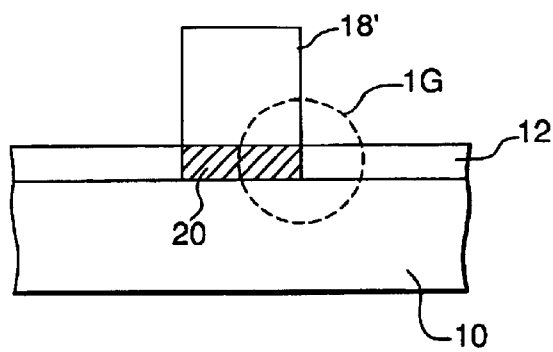

Referring to FIG. 1D, the sacrificial layer 14 is removed in an etch process, leaving gate trench metal layer 18 and layer 12. The metal layer 18 and layer 12 are then processed to form high-K dielectric layer 20 and leaving gate electrode portion 18' (FIG. 1E). One exemplary processing technique for forming high-K dielectric layer 20 includes thermal treatment of the layers 18 and 12, such that metal from layer 18 diffuses into layer 12 and reacts therewith to form a high-K dielectric layer 20. The processing temperature and time may vary depending upon the materials selected for layers 12 and 18, but generally should be in the range of about 600–800° C. for about 4–8 hours. Infrared irradiation or RF power treatment may also be employed to promote reaction between the layers 18 and 12 to form high-K dielectric layer 20.

Figure 1F:
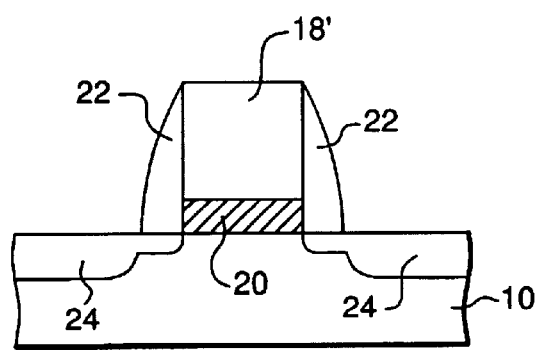
Figure 1G:
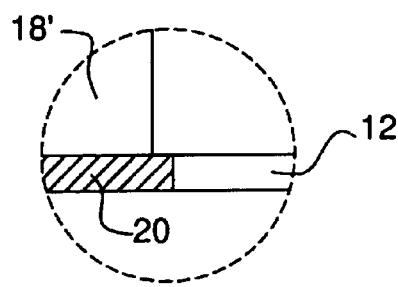

FIG. 1G is a partial view of a portion of FIG. 1E illustrating the high-K dielectric layer 20 formed from the dielectric layer 12 and metal layer 18'. The metal atoms diffuse into dielectric layer 12, forming high-K dielectric layer 20 that extends partially beyond the lateral boundary of metal layer 18'.

The desired thickness of high-K dielectric layer can be controlled through the deposited thickness of the layer 12 and amount of diffusion of the metal into the layer 12. The former is easily controlled through known deposition techniques. The latter may be controlled through process parameters, e.g., temperature and time (or frequency if infrared or RF techniques are employed). Generally, the desired thickness of the resultant high-K layer 20 ranges from about 10 Å to greater than 100 Å, depending on the K value of the particular high-K material formed as described above.

This method of forming the high-K dielectric layer provides for excellent control of the formation of the high-K dielectric layer of, for example, a gate structure, and alleviates the need to etch a deposited high-K dielectric layer, while simultaneously forming at least a portion of a metal gate electrode over the high-K dielectric layer. This, in turn, improves the ability to meet critical dimensions and control effective oxide thickness of the high-K dielectric layer. For purposes of this description, "effective oxide thickness (EOT)" is defined as the thickness silicon oxide would have to be in order to have the same capacitance per unit area as the high-K dielectric. For the same effective oxide thickness, the physical thickness of a high-K dielectric layer is thicker than the pure oxide, due to the higher dielectric constant.

After the high-K dielectric layer 20 is formed, the remaining portion of layer 12 (i.e., the unreacted portion) is removed and the device is thereafter completed per conventional processing techniques, such as self-aligned techniques, as shown in FIG. 1F, i.e., spacers 22 and doped regions 24 are formed. Instead of a single impurity introduction to form source and drain regions, the source and drain regions may be formed using a lightly-doped impurity distribution self-aligned to gate conductor 18' and a heavily-doped impurity distribution self-aligned to lateral surfaces of the spacers 22, as is well-known in the art. Following the formation of the source and drain regions, a salicide process may optionally be performed in a manner well-known in the art to form silicide regions (not shown) on the upper surfaces of the source and drain regions.

Figure 2A:
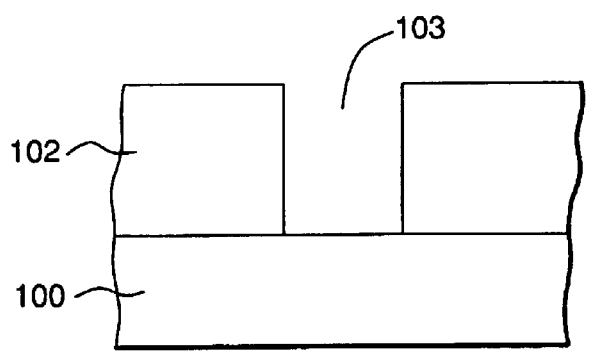
FIGS. 2A–2G illustrate a second exemplary method of forming a device structure including a high-K dielectric layer.

FIGS. 2A–2G illustrate a second embodiment of a method of fabricating a semiconductor device including a high-K dielectric material. Referring first to FIG. 2A, a semiconductor substrate 100, such as a silicon, germanium or silicon on insulator (SOI) substrate, is provided. A sacrificial layer 102 is deposited over substrate 100 and patterned and etched to form a gate trench region 102 therein. Sacrificial layer 102 should have an etch rate that is higher relative to a selected etchant than the substrate 100 (or other layer formed between the substrate 100 and sacrificial layer 102) so that the substrate 100 (or other layer) can be used as an etch stop layer in the removal of sacrificial layer 102. Of course, the etchant may be selected such that substrate 100 (or other layer formed between the substrate 100 and sacrificial layer 102) is inert to the etchant. In one embodiment, sacrificial layer 102 is silicon nitride and is formed to a thickness of between about 1500–2000 Å.

Figure 2B:
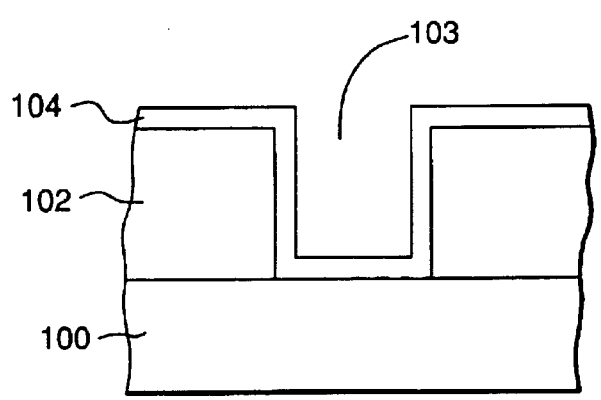

A dielectric layer 104 is then conformally deposited, such as by chemical vapor deposition, over the sacrificial layer 102 and in trench region 103 (FIG. 2B). Layer 104 may include a material and be deposited to a thickness described above in connection with dielectric layer 12 of the first embodiment of the present method.

Figure 2C:
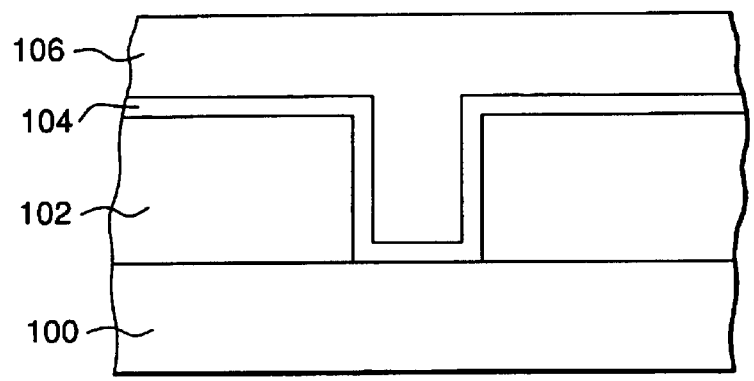
Figure 2D:
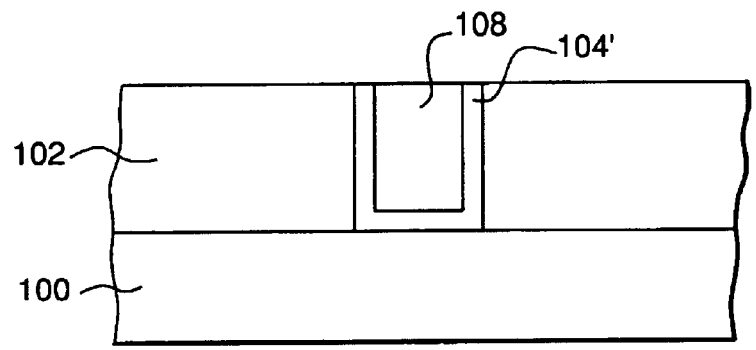
Figure 2E:
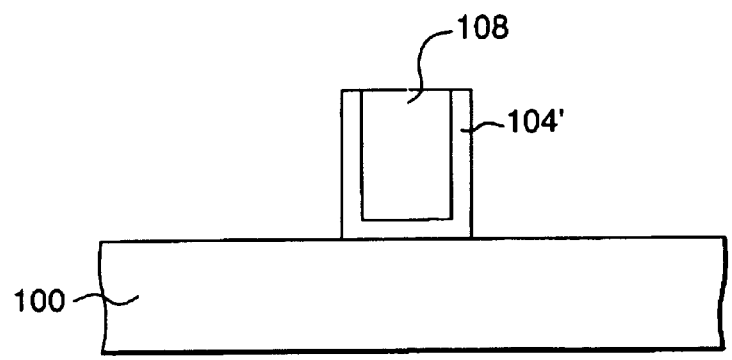
Figure 2F:
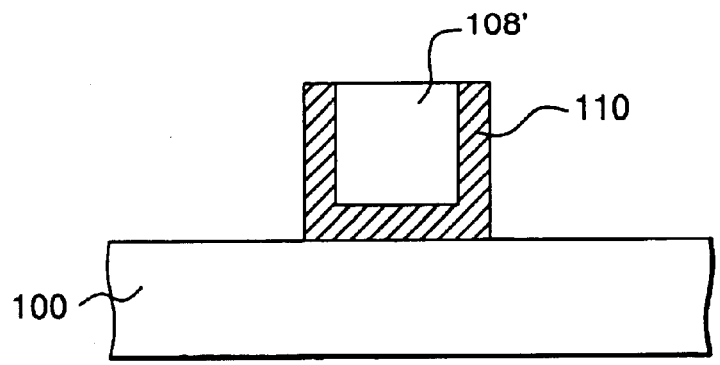
Figure 2G:
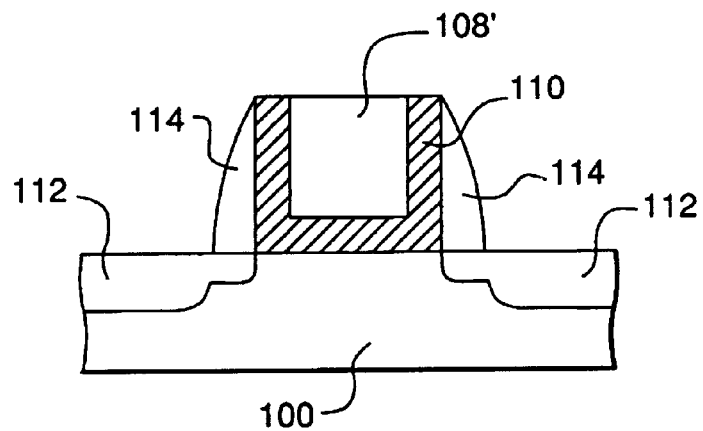

A metal layer 106 is then deposited, such as by physical vapor deposition, over the layer 104 and within trench region 103 (FIG. 2C). This structure is then planarized, such as in a CMP process, to polish the metal layer 106 and layer 104 to sacrificial layer 102, leaving gate trench metal portion 108 and portion 104' of dielectric layer 104. The remaining portion of sacrificial layer 102 is then removed in an etch process (FIG. 2E). In the manner described above, the remaining portions 108 and 104' are then processed to form high-K dielectric layer 110 while leaving metal portion 108' (FIG. 2F), which may form at least a portion of a gate electrode of a transistor device. As described above, the device structure is then completed, such as by conventional processing techniques, to form spacer elements 114 and doped regions 112 (FIG. 2G).

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming an integrated circuit, comprising the steps of:

(a) forming a sacrificial layer over a substrate, said sacrificial layer having a gate trench formed therein and a first layer of a first material formed over said substrate in said gate trench;

(b) forming a second layer of a second material over said first layer in said gate trench; and (c) processing said first and second layers to form a layer of a high-K dielectric material.

2. The method of claim 1, wherein said first material is an oxide and said second material is a metal.

3. The method of claim 2, wherein said first material is a silicon oxide and said second material is selected from the group consisting of Hafnium, Tantalum, Zirconium, Titanium, Yttrium and Lanthanum.

4. The method of claim 1, wherein at least a portion of said second layer forms a gate electrode of a transistor device.

5. The method of claim 1, wherein said processing step includes the step of heating said first and second layers.

6. The method of claim 5, wherein said processing step includes the step of heating said first and second layers at a temperature between about 600–800° C. for between about 4–8 hours.

7. The method of claim 1, further comprising the steps of:

polishing said second layer to a top surface of said sacrificial layer; and after said polishing step, removing said sacrificial layer.

8. The method of claim 7, wherein said processing step occurs after said removing step.

9. The method of claim 8, wherein step (a) includes the step of:

forming said first layer over said substrate;

depositing said sacrificial layer over said first layer; and patterning and etching said sacrificial layer to form said gate trench, thereby exposing said first layer in said gate trench.

10. The method of claim 9, further comprising the steps of:
 after said processing step, removing portions of said first layer that are not reacted with said second layer; and
 forming a transistor device including said high-K dielectric material wherein an unreacted portion of said second layer forms at least a portion of a gate electrode of said transistor device.

11. The method of claim 1, wherein step (a) includes the following steps:
 forming said sacrificial layer over said substrate;
 pattering and etching said sacrificial layer to form a gate trench; and
 conformally depositing said first layer along said sacrificial layer after forming said gate trench.

12. The method of claim 11, wherein said forming step (b) includes the step of depositing said second layer over said first layer and in said gate trench, said method further comprising the steps of:
 polishing said second layer to a top surface of said sacrificial layer; and
 after said polishing step, removing said sacrificial layer.

13. The method of claim 12, wherein said processing step occurs after said removing step.

14. The method of claim 13, further comprising the step of forming a transistor device including said high-K dielectric material, wherein an unreacted portion of said second layer forms at least a portion of a gate electrode of said transistor device.

15. A method of forming an integrated circuit including a transistor device having a high-K dielectric layer, comprising the following steps:
 forming an oxide layer over a substrate;
 forming a sacrificial layer over said oxide layer;
 forming a gate trench in said sacrificial layer, thereby exposing said oxide layer in said gate trench;
 depositing a metal layer in said gate trench;
 removing said sacrificial layer;
 processing said oxide layer and metal layer to form a high-K dielectric layer; and
 completing said transistor device, wherein said high-K dielectric layer forms at least a portion of a gate dielectric of said transistor device.

16. The method of claim 15, wherein an unreacted portion of said metal layer in said gate trench forms at least a portion of a gate electrode of said transistor device.

17. The method of claim 16, wherein said dielectric layer is a silicon oxide and said metal layer is selected from the group consisting of Hafnium, Tantalum, Zirconium, Titanium, Yttrium and Lanthanum.

18. The method of claim 17, wherein said removing step includes an etch process and said sacrificial layer has a higher etch rate relative to a selected etchant in said etch process than said oxide layer.

19. The method of claim 17, wherein said processing step includes the step of heating said dielectric layer and metal layer.

20. The method of claim 17, wherein said processing step includes the step of heating said first and second layers at a temperature between about 600–800° C. for between about 4–8 hours.

21. A method of forming an integrated circuit including a transistor device having a high-K dielectric layer, comprising the following steps:
 forming a sacrificial layer over a substrate;
 forming a gate trench in said sacrificial layer;
 after forming said gate trench, conformally depositing an oxide layer along said sacrificial layer;
 depositing a metal layer in said gate trench over said oxide layer;
 removing said sacrificial layer;
 processing said oxide layer and metal layer to form a high-K dielectric layer; and
 completing said transistor device, wherein said high-K dielectric layer forms at least a portion of a gate dielectric of said transistor device.

22. The method of claim 21, wherein an unreacted portion of said metal layer in said gate trench forms at least a portion of a gate electrode of said transistor device.

23. The method of claim 22, wherein said dielectric layer is a silicon oxide and said metal layer is selected from the group consisting of Hafnium, Tantalum, Zirconium, Titanium Yttrium and Lanthanum.

24. The method of claim 23, wherein said processing step includes the step of heating said dielectric layer and metal layer.

25. The method of claim 24, wherein said processing step includes the step of heating said first and second layers at a temperature between about 600–800° C. for between about 4–8 hours.

* * * * *